US012634041B2

(12) United States Patent
Dai et al.

(10) Patent No.: US 12,634,041 B2
(45) Date of Patent: May 19, 2026

(54) RETRANSMISSION METHOD AND APPARATUS

(71) Applicant: HUAWEI TECHNOLOGIES CO., LTD., Shenzhen (CN)

(72) Inventors: Shengchen Dai, Hangzhou (CN); Gongzheng Zhang, Hangzhou (CN); Rong Li, Hangzhou (CN); Yunfei Qiao, Hangzhou (CN); Xianbin Wang, Hangzhou (CN); Jun Wang, Hangzhou (CN); Wen Tong, Ottawa (CA); Jian Wang, Hangzhou (CN); Jian Wang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 573 days.

(21) Appl. No.: 18/160,008

(22) Filed: Jan. 26, 2023

(65) Prior Publication Data

US 2023/0171033 A1     Jun. 1, 2023

Related U.S. Application Data

(63) Continuation of application No. PCT/CN2021/106609, filed on Jul. 15, 2021.

(30) Foreign Application Priority Data

Jul. 30, 2020     (CN) .......................... 202010754266.0
Aug. 10, 2020    (CN) .......................... 202010797814.8
(Continued)

(51) Int. Cl.
*H04L 1/08*         (2006.01)
*H03M 13/13*     (2006.01)
*H04L 1/00*         (2006.01)

(52) U.S. Cl.
CPC .............. *H04L 1/08* (2013.01); *H03M 13/13* (2013.01); *H04L 1/0061* (2013.01); *H04L 1/0067* (2013.01)

(58) Field of Classification Search
None
See application file for complete search history.

(56) References Cited

U.S. PATENT DOCUMENTS 10,389,485 B2 *   8/2019   Zhou ...................... H04L 1/0041
11,303,394 B2 *   4/2022   Zhang ....................... H04L 1/18
(Continued)

FOREIGN PATENT DOCUMENTS

CN            111434042 A       7/2020
JP         2019510446 A  *   4/2019   ........... H04L 1/1819
(Continued)

OTHER PUBLICATIONS

JP_2019510446_A_I_English_Translation (Year: 2019).*
(Continued)

*Primary Examiner* — Ayaz R Sheikh
(74) *Attorney, Agent, or Firm* — HAUPTMAN HAM, LLP

(57) ABSTRACT

A retransmission method includes obtaining, by a sending apparatus, a to-be-encoded bit sequence comprising K to-be-encoded bits, where K is a positive integer. The method also includes performing polar encoding on the to-be-encoded sequence to obtain an encoded first bit sequence. A length of the first bit sequence is N0. The method also includes determining an initial transmission version RV0. The method also includes determining a length E1 of a retransmission version RV1. The method also includes determining the retransmission version RV1 based on an initial transmission code rate RO. The method also includes sending the RV1.

26 Claims, 7 Drawing Sheets

(30) Foreign Application Priority Data

Aug. 12, 2020  (CN) .......................... 202010809384.7
Jan. 26, 2021  (CN) .......................... 202110109625.1

(56)               References Cited

U.S. PATENT DOCUMENTS

2018/0026751 A1 *  1/2018  Li ......................... H04L 1/0041
                                                                714/751
2018/0115393 A1    4/2018  Zhang et al.
2020/0137616 A1 *  4/2020  Davydov .......... H04W 28/0273

FOREIGN PATENT DOCUMENTS

JP    2022534171 A  *  7/2022  .......... H04L 1/1874
WO    2013135022 A1    9/2013
WO    2019095886 A1    5/2019
WO    2019157764 A1    8/2019
WO    2020034332 A1    2/2020
WO    2020042161 A1    3/2020

OTHER PUBLICATIONS

JP_2022534171_A_I_English_Translation (Year: 2022).*
Ericsson: "RV selection fro AUL transmissions" 3GPP Draft;
R1-1720933, 3rd Generation Partnership Project (3GPP), Mobile
Competence Centre; 650, Route Des Lucioles; F-06921 Sophia-
Antipolis Cedex; France, vol. RAN WG1, No. Reno, US; Nov. 27,
2017-Dec. 1, 2017, Nov. 17, 2017 (Nov. 17, 2017), XP051369116,
total 3 pages.

Extended European Search Report issued in corresponding Euro-
pean Application No. 21849200.7, dated Dec. 7, 2023, pp. 1-9.
India Office Action issued in corresponding India Application No.
202337010866, dated Feb. 5, 2024, pp. 1-6.
Huawei et al:"HARQ scheme for polar codes." 3GPP TSG RAN
WG1 Meeting #87 R1-1611255 Reno, USA, Nov. 14-18, 2016. total
25 pages.
India Hearing Notice issued in corresponding India Application No.
202337010866, dated Oct. 4, 2024, pp. 1-2.
Japanese Office Action issued in corresponding Japanese Applica-
tion No. 2023-506038, dated Oct. 8, 2024, pp. 1-8.
Focai Peng, et al.,Parallel Concatenation Codes with Polar Com-
ponent Codes for Incremental Redundancy Hybrid Automatic Repeat
reQuest Functionality,2020 International Wireless Communications
and Mobile Computing (IWCMC) Jul. 27, 2020,total 8 pages.
3GPP TSG RAN WG1 #92,R1-1801469,"HARQ for Polar
codes",Huawei, HiSilicon,Feb. 26-Mar. 2, 2018, total 5 pages.
Office action dated May 14, 2024 from corresponding application
No. JP 2023-506038.
NTT Docomo, Inc. (Rapporteur) et al.,"RAN WG's progress on NR
WI in the November meeting 2017", 3GPP TSG-RAN WG2 Nr
Ad-hoc 1801, Jan. 22-26, 2018 Vancouver, Canada, R2-1800217,
total:116pages.
International Search Report issued in corresponding International
Application No. PCT/CN2021/106609, dated Oct. 19, 2021, pp.
1-8.

* cited by examiner

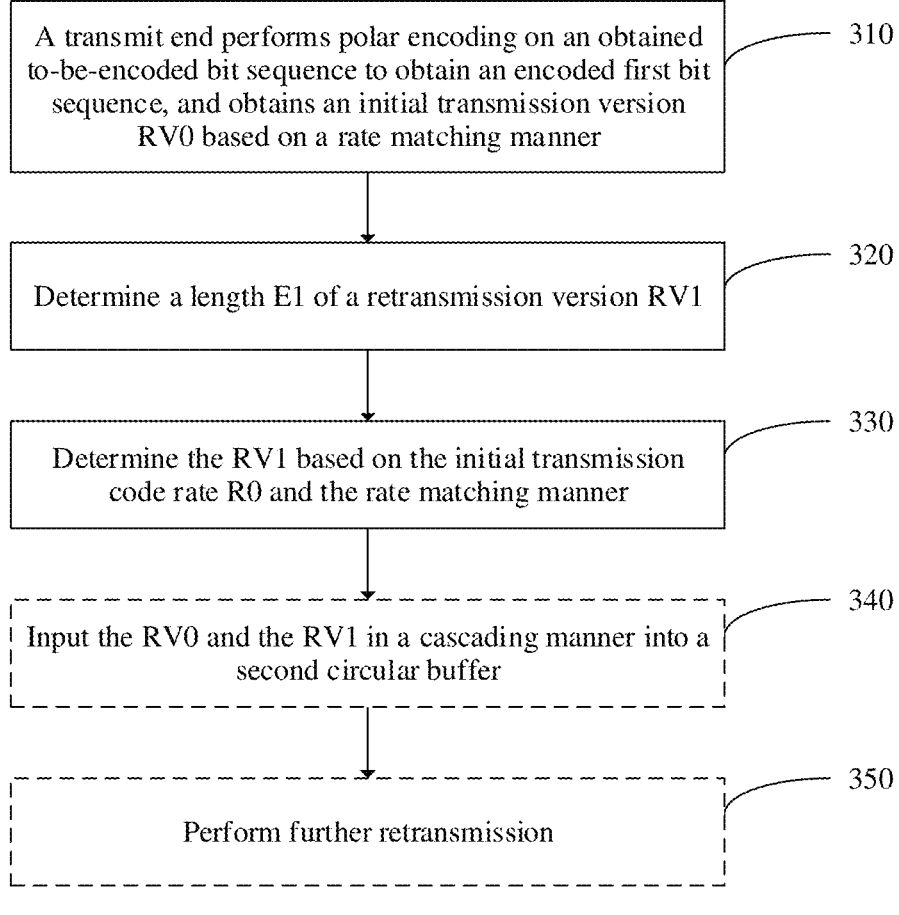

A transmit end performs polar encoding on an obtained to-be-encoded bit sequence to obtain an encoded first bit sequence, and obtains an initial transmission version RV0 based on a rate matching manner ⎯ 310

Determine a length E1 of a retransmission version RV1 ⎯ 320

Determine the RV1 based on the initial transmission code rate R0 and the rate matching manner ⎯ 330

Input the RV0 and the RV1 in a cascading manner into a second circular buffer ⎯ 340

Perform further retransmission ⎯ 350

FIG. 3

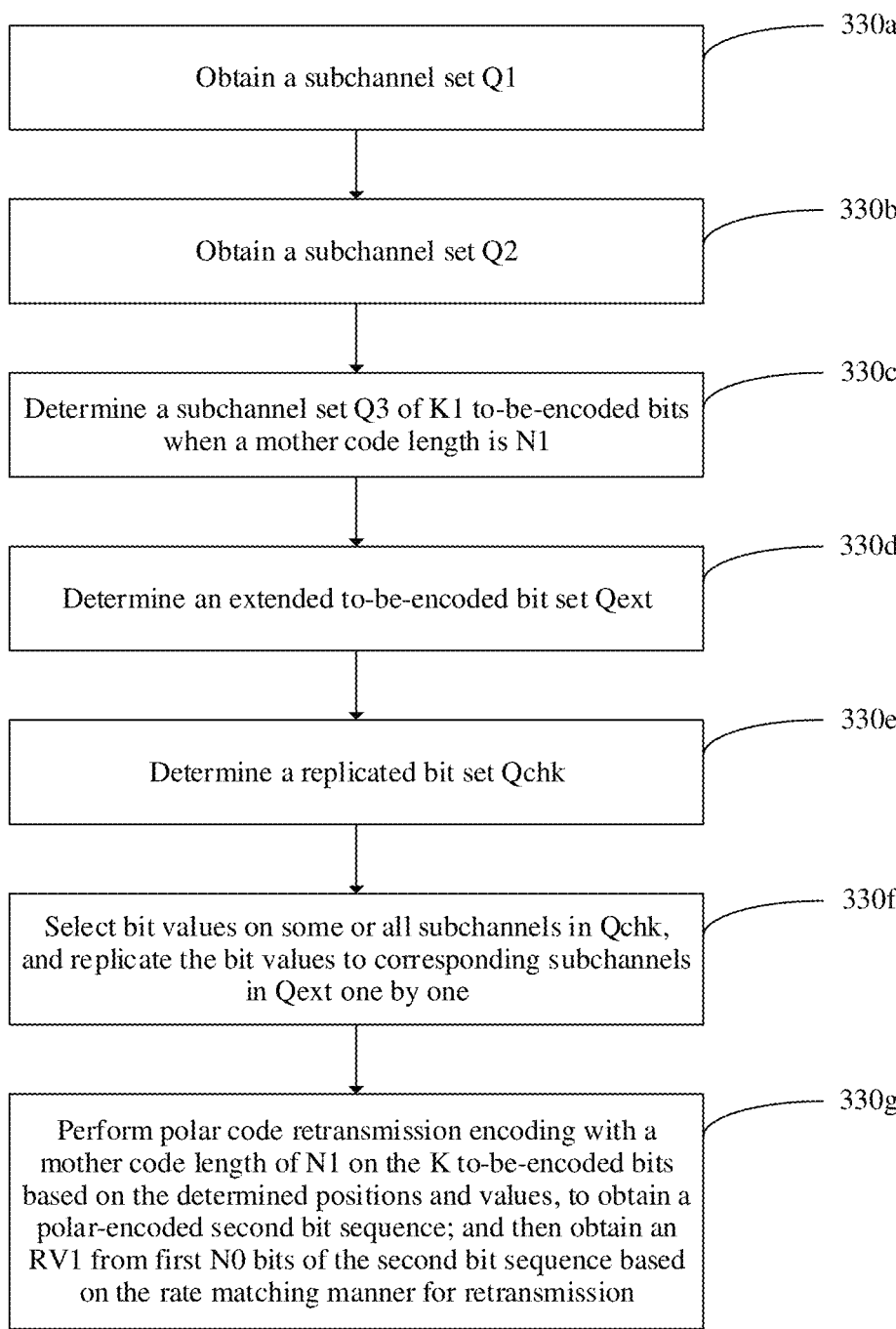

Obtain a subchannel set Q1 — 330a

Obtain a subchannel set Q2 — 330b

Determine a subchannel set Q3 of K1 to-be-encoded bits when a mother code length is N1 — 330c Determine an extended to-be-encoded bit set Qext — 330d Determine a replicated bit set Qchk — 330e Select bit values on some or all subchannels in Qchk, and replicate the bit values to corresponding subchannels in Qext one by one — 330f Perform polar code retransmission encoding with a mother code length of N1 on the K to-be-encoded bits based on the determined positions and values, to obtain a polar-encoded second bit sequence; and then obtain an RV1 from first N0 bits of the second bit sequence based on the rate matching manner for retransmission — 330g

FIG. 4

RETRANSMISSION METHOD AND APPARATUS

CROSS-REFERENCE TO RELATED APPLICATIONS

This application is a continuation of International Patent Application No. PCT/CN2021/106609, filed on Jul. 15, 2021, which claims priority to Chinese Patent Application No. 202010754266.0, filed on Jul. 30, 2020 and Chinese Patent Application No. 202110109625.1, filed on Jan. 26, 2021 and Chinese Patent Application No. 202010809384.7, filed on Aug. 12, 2020 and Chinese Patent Application No. 202010797814.8, filed on Aug. 10, 2020. All of the afore-mentioned patent applications are hereby incorporated by reference in their entireties.

TECHNICAL FIELD

Embodiments of this application relate to the field of communications technologies, and in particular, to a retransmission method and an apparatus.

BACKGROUND

As a most basic wireless access technology, channel encoding plays an important role in ensuring reliable data transmission. In an existing wireless communications system, a turbo code, a low-density parity-check (LDPC) code, and a polar code are generally used for channel encoding. The turbo code cannot support information transmission at a too low or too high code rate. For transmission of medium and short packets, the turbo code and the LDPC code are difficult to achieve ideal performance under a limited code length due to encoding and decoding characteristics of the turbo code and the LDPC code. In terms of implementation, the turbo code and the LDPC code have relatively high computational complexity in encoding and decoding imple-mentation processes. The polar code is a good code that can obtain a Shannon capacity as theoretically proven and that has relatively low encoding and decoding complexity. Therefore, the polar code is increasingly more widely used. In a 5th generation (5G) communications system, the polar code is determined as an encoding scheme of a control channel. Therefore, an encoding procedure of the polar code is specified in detail in a standard, including segmentation, determining a rate matching manner, and specific processes such as mapping, encoding, and rate matching of an infor-mation bit and a check bit (including a cyclic redundancy check bit and/or a parity check bit) on a polarized channel.

However, in the 5G standard, the polar code is used only for the control channel, and therefore, a hybrid automatic repeat request (HARQ) mechanism is not designed. In a data channel, use of HARQ effectively enhances transmission reliability and further increases a system throughput. There-fore, how to design a proper HARQ solution for a polar code encoding mechanism becomes a problem that urgently needs to be resolved in a topic of applying the polar code to data channel transmission.

SUMMARY

Embodiments of this application provide a retransmission method and an apparatus that are applied to wireless com-munication, which have an advantage of simple implemen-tation.

Specific technical solutions provided in embodiments of this application are as follows:

According to a first aspect, a retransmission method is provided, including:

a sending apparatus obtains a to-be-encoded bit sequence including K to-be-encoded bits, where K is a positive integer;

performing polar encoding on the to-be-encoded sequence to obtain an encoded first bit sequence, where a length of the first bit sequence is N0; and determining an initial transmission version RV0;

determining a length E1 of a retransmission version RV1;

determining the retransmission version RV1 based on an initial transmission code rate R0; and sending the RV1.

According to such an implementation method, on one hand, a design in an existing standard is reused as much as possible, and on the other hand, an advantage of an existing HARQ mechanism is absorbed. Therefore, implementation is simple, and performance can also meet a requirement.

In a possible design, the determining the retransmission version RV1 based on an initial transmission code rate R0 includes:

when R0 is less than or equal to a preset code rate threshold R_threshold, determining that the RV1 is E1 bits read from a first circular buffer for initial trans-mission; or when R0 is greater than R_threshold, generating an encoded second bit sequence in an incremental redun-dancy IR manner, and obtaining the RV1 based on the second bit sequence, where a length of the second bit sequence is N1, and N1=2*N0.

In a possible design, the obtaining the RV1 based on the second bit sequence is:

obtaining a subchannel set Q1, where Q1 includes K elements, and the K elements are sequence numbers of K subchannels used to place the K to-be-encoded bits during initial transmission;

obtaining a subchannel set Q2, where Q2(i)=Q1(i)+N0; i=0, 1, . . . , and K−1, and N0 is a mother code length of a polar code used during initial transmission;

obtaining a subchannel set Q3, where Q3(i)<N0, or Q3(i) ∈Q2; and i=0, 1, . . . , and K−1;

determining an extended to-be-encoded bit set Qext, where an element in Qext is an element that is in Q3 and that is less than N0;

determining a replicated bit set Qchk=Q2\(Q3\Qext); and performing, based on Q2, Q3, Qext, and Qchk, polar code encoding with a mother code length of N1 on the K to-be-encoded bits, to obtain the second bit sequence.

In a possible design, Q3 is determined based on a reli-ability ordering sequence whose length is N1 and a rate matching manner for retransmission.

In a possible design, the performing, based on Q2, Q3, Qext, and Qchk, polar code encoding with a mother code length of N1 on the K to-be-encoded bits includes:

selecting bit values on some or all subchannels in Qchk, and replicating the bit values to corresponding sub-channels in Qext one by one.

In a possible design, the obtaining the RV1 based on the second bit sequence is:

obtaining the RV1 from first N0 bits of the second bit sequence based on the rate matching manner for retransmission.

In a possible design, before the sending apparatus obtains a to-be-encoded bit sequence including K to-be-encoded bits, the method further includes:

performing segmentation based on a transport block size TBS.

In a possible design, a segment quantity C of the segmentation is:

$$C = \begin{cases} \lceil (TBS + TBcrc)/\text{K\_threshold} \rceil & TBS > \text{K\_threshold} \\ 1 & else \end{cases}$$

Herein, TBcrc is a quantity of cyclic redundancy check CRC bits at a transport block TB level, and K_threshold is a preset first threshold.

In a possible design, $$K = \begin{cases} \lceil (TBS + TBcrc)/C \rceil + CBcrc & C > 1 \\ TBS + TBcrc & C = 1 \end{cases}$$

Herein, CBcrc is a quantity of CRC bits at a code block CB level.

In a possible design, $$TBS = 2^{n2} * C * \lceil (N'_{info} + TBcrc)/(2^{n2} * C) \rceil - TBcrc$$

Herein, $2^{n2}$ is a quantization unit, n2 is a positive integer, and $N'_{info}$ is obtained by adjusting, based on a quantization level, a volume $N_{info}$ of data that may be transmitted.

In a possible design, $N'_{ingo}$ is:

$$N'_{info} = \max(TBS\min, 2^n * \text{round}((N_{info} - TBcrc)/2^n))$$

$$n = \max(n_{min}, \lfloor \log 2(N_{info} - TBcrc) \rfloor - n0)$$

Herein, TBSmin is a minimum transport block size, round is a rounding operation, n is a quantization level of a to-be-transmitted transport block, $n_{min}$ is a minimum quantization level, n0 is a quantized adjustment value, and $\lfloor \ \rfloor$ is a rounding down operation.

In a possible design, the method further includes:

the sending apparatus inputs the RV0 and the RV1 in a cascading manner into a second circular buffer; and the sending apparatus performs retransmission based on the RV0 and the RV1.

According to a second aspect, a retransmission method is provided, including:

a receiving apparatus receives a received signal including information of K to-be-encoded bits, where a mother code length corresponding to the received signal is N0; and determines an initial transmission version RV0; determining a length E1 of a retransmission version RV1;

determining the retransmission version RV1 based on an initial transmission code rate R0; and performing decoding based on the RV0 and the RV1.

In a possible design, the determining the retransmission version RV1 based on an initial transmission code rate R0 includes:

when R0 is less than or equal to a preset code rate threshold R_threshold, determining that the RV1 is E1 bits read from a first circular buffer for initial transmission; or when R0 is greater than R_threshold, the RV1 based on an encoded second bit sequence generated in an incremental redundancy manner, where a length of the second bit sequence is N1, and N1=2*N0.

In a possible design, the second bit sequence is obtained based on a subchannel Q1, a subchannel set Q2, a subchannel set Q3, an extended to-be-encoded bit set Qext, and a replicated bit set Qchk, where:

Q1 includes K elements, and the K elements are sequence numbers of K subchannels used to place the K to-be-encoded bits during initial transmission;

Q2(i)=Q1(i)+N0; i=0, 1, . . . , and K−1, and N0 is a mother code length of a polar code used during initial transmission;

Q3(i)<N0, or Q3(i)∈Q2; and i=0, 1, . . . , and K−1;

for Qext, an element in Qext is an element that is in Q3 and that is less than N0; and Qchk=Q2\(Q3\Qext).

In a possible design, Q3 is determined based on a reliability ordering sequence whose length is N1 and a rate matching manner for retransmission.

In a possible design, the second bit sequence is obtained based on a subchannel Q1, a subchannel set Q2, a subchannel set Q3, an extended to-be-encoded bit set Qext, and a replicated bit set Qchk includes:

selecting bit values on some or all subchannels in Qchk, and replicating the bit values to corresponding subchannels in Qext one by one.

In a possible design, the obtaining the RV1 based on an encoded second bit sequence is: obtaining the RV1 from first N0 bits of the second bit sequence based on the rate matching manner for retransmission.

In a possible design, the method further includes: segmenting a received to-be-decoded transport block based on a transport block size TBS.

In a possible design, a segment quantity C of the segmentation is:

$$C = \begin{cases} \lceil (TBS + TBcrc)/\text{K\_threshold} \rceil & TBS > \text{K\_threshold} \\ 1 & else \end{cases}$$

Herein, TBcrc is a quantity of cyclic redundancy check CRC bits at a transport block TB level, and K_threshold is a preset first threshold.

In a possible design, $$K = \begin{cases} \lceil (TBS + TBcrc)/C \rceil + CBcrc & C > 1 \\ TBS + TBcrc & C = 1 \end{cases}$$

Herein, CBcrc is a quantity of CRC bits at a code block CB level.

In a possible design, $$TBS = 2^{n2} * C * \lceil (N'_{info} + TBcrc)/(2^{n2} * C) \rceil - TBcrc$$

Herein, $2^{n2}$ is a quantization unit, n2 is a positive integer, and $N'_{info}$ is obtained by adjusting, based on a quantization level, a volume $N_{info}$ of data that may be transmitted.

In a possible design, $N'_{info}$ is:

$$N'_{info} = \max(TBS\min, 2^n * \text{round}((N_{info} - TBcrc)/2^n))$$

$$n = \max(n_{min}, \lfloor \log 2(N_{info} - TBcrc) \rfloor - n0)$$

Herein, TBSmin is a minimum transport block size, round is a rounding operation, n is a quantization level of a to-be-transmitted transport block, $n_{min}$ is a minimum quantization level, n0 is a quantized adjustment value, and $\lfloor \ \rfloor$ is a rounding down operation.

According to a third aspect, a sending apparatus is provided. The apparatus has a function of implementing the method described in any one of the first aspect or the possible designs of the first aspect. The function may be implemented by hardware, or may be implemented by hardware executing corresponding software. The hardware or the software includes one or more modules corresponding to the foregoing function.

In a possible design, when the function is partially or wholly implemented by hardware, the sending apparatus includes: an input interface circuit, configured to obtain a to-be-transmitted transport block; a logic circuit, configured to perform the behavior described in any one of the first aspect or the possible designs of the first aspect; and an output interface circuit, configured to output an encoded sequence or a retransmitted sequence.

Optionally, the sending apparatus may be a chip or an integrated circuit.

In a possible design, when the function is partially or wholly implemented by software, the sending apparatus includes: a memory, configured to store a program; and a processor, configured to execute the program stored in the memory. When the program is executed, the sending apparatus may implement the method described in any one of the first aspect or the possible designs of the first aspect.

Optionally, the memory may be a physically independent unit, or may be integrated with the processor.

In a possible design, when the function is partially or wholly implemented by software, the sending apparatus includes a processor. A memory configured to store a program is located outside the sending apparatus. The processor is connected to the memory by using a circuit/wire, and is configured to read and execute the program stored in the memory.

In a possible design, the apparatus is a network device or a terminal.

According to a fourth aspect, a receiving apparatus is provided. The apparatus has a function of implementing the method described in any one of the second aspect or the possible designs of the second aspect. The function may be implemented by hardware, or may be implemented by hardware executing corresponding software. The hardware or the software includes one or more modules corresponding to the foregoing function.

In a possible design, when the function is partially or wholly implemented by hardware, the receiving apparatus includes: an input interface circuit, configured to obtain a received signal; a logic circuit, configured to perform the behavior described in any one of the second aspect or the possible designs of the second aspect; and an output interface circuit, configured to output a decoding result.

Optionally, the receiving apparatus may be a chip or an integrated circuit.

In a possible design, when the function is partially or wholly implemented by software, the receiving apparatus includes: a memory, configured to store a program; and a processor, configured to execute the program stored in the memory. When the program is executed, the receiving apparatus may implement the method described in any one of the second aspect or the possible designs of the second aspect.

Optionally, the memory may be a physically independent unit, or may be integrated with the processor.

In a possible design, when the function is partially or wholly implemented by software, the receiving apparatus includes a processor. A memory configured to store a program is located outside the receiving apparatus. The processor is connected to the memory by using a circuit/wire, and is configured to read and execute the program stored in the memory.

In a possible design, the apparatus is a network device or a terminal.

According to a fifth aspect, a computer storage medium is provided, and stores a computer program. The computer program includes instructions used to perform the method described in any one of the first aspect or the possible designs of the first aspect.

According to a sixth aspect, a computer storage medium is provided, and stores a computer program. The computer program includes instructions used to perform the method described in any one of the second aspect or the possible designs of the second aspect.

According to a seventh aspect, an embodiment of this application provides a computer program product including instructions. When the instructions are run on a computer, the computer is enabled to perform the methods described in the foregoing aspects.

According to an eighth aspect, a wireless device is provided, including a sending apparatus and a transceiver that are configured to implement any one of the first aspect or the possible designs of the first aspect.

The transceiver is configured to receive or send a signal.

In a possible design, the wireless device is a terminal or a network device.

According to a ninth aspect, a wireless device is provided, including a receiving apparatus and a transceiver that are configured to implement any one of the second aspect or the possible designs of the second aspect.

The transceiver is configured to receive or send a signal.

In a possible design, the wireless device is a terminal or a network device.

BRIEF DESCRIPTION OF DRAWINGS

FIG. 3 is a schematic flowchart of RV version determining according to an embodiment of this application;

FIG. 4 is a schematic flowchart of RV1 version determining according to an embodiment of this application;

DESCRIPTION OF EMBODIMENTS

Figure 1:
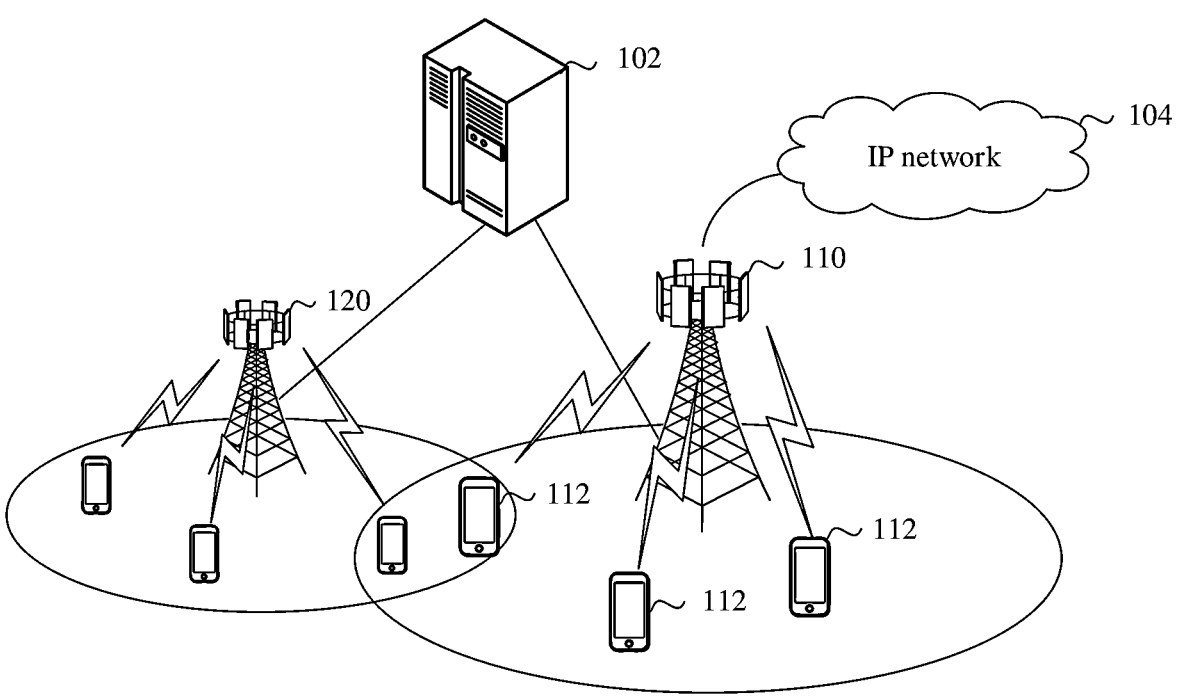
FIG. 1 is a schematic diagram of an architecture of an applied communications system according to an embodiment of this application.

The following describes in detail embodiments of this application with reference to accompanying drawings.

When a polar code is considered to be generalized to a data channel, a reasonable idea is to reuse a polar code encoding method in an existing 5G standard as much as possible, for example, a nesting feature between mother code sequences of different lengths, and a principle for selecting a rate matching manner. Certainly, this is not limited in this application.

Embodiments of this application provide a polar code encoding method, including new data segmentation and HARQ methods.

For ease of understanding of embodiments of this application, the following briefly describes the polar code.

In an encoding policy of the polar code, useful information of a user is transmitted by using a noiseless channel, and agreed information or no information is transmitted by using a pure noisy channel. The polar code is also a linear block code. An encoding matrix of the polar code is $G_N$, and an encoding process is $$x_1^N = u_1^N G_N,$$

where $$u_1^N = (u_1, u_2, \ldots, u_N)$$

is a binary row vector with a length of N (that is, a code length; it may be seen that lengths of sequences x and u before and after encoding are both N, and N is also referred to as a mother code length); and $G_N$ is a N×N matrix, and $$G_N = F_2^{\otimes(log_2(N))} \cdot F_2^{\otimes(log_2(N))}$$

is defined as a Kronecker product of $log_2$ N matrices $F_2$, and the matrix $$F_2 = \begin{bmatrix} 1 & 0 \\ 1 & 1 \end{bmatrix}.$$

In some implementation solutions, $G_N$ further includes a transposed matrix $B_N$. However, essence of polar encoding is not affected. Therefore, this is not limited. A solution in which $B_N$ is not used is still used as an example in this application.

In the encoding process of the polar code, some bits in $$u_1^N$$

are used to carry information, and are referred to as an information bit set, and a set of indexes of the bits is denoted by A. Some other bits are set to fixed values agreed in advance by a receive end and a transmit end, and are referred to as a frozen bit set or frozen bits, and a set of indexes of the bits is denoted by a complementary set $A^c$ of A. The encoding process of the polar code is equivalent to:

$$x_1^N = U_A G_N(A) \oplus_{U_{A^C}} G_N(A^C).$$

Herein, $G_N(A)$ is a submatrix obtained from rows that are in $G_N$ and that correspond to the indexes in the set A, and $G_N(A^C)$ is a submatrix obtained from rows that are in $G_N$ and that correspond to the indexes in the set $A^c$. $u_A$ is the information bit set in $$u_1^N,$$

and a quantity is K. Generally, one or more of various types of check bits, including but not limited to a cyclic redundancy check (CRC) bit and a parity check (PC) bit, may also be included in the information bit set. $u_{A^c}$ is the frozen bit set in $$u_1^N,$$

a quantity of frozen bits is (N−K), and the frozen bits are known bits. The frozen bits are usually set to 0, but the frozen bits may be arbitrarily set as long as the receive end and the transmit end agree in advance. Therefore, encoding output of the polar code may be simplified as:

$$x_1^N = U_A G_N(A).$$

Herein, $u_A$ is the information bit set in $$u_1^N; u_A$$

is a row vector with a length of K, that is, |A|=K, where |·| represents a quantity of elements in the set, and K is an information block size; and $G_N(A)$ is a submatrix obtained from rows that are in the matrix $G_N$ and that correspond to the indexes in the set A, and $G_N(A)$ is a K×N matrix.

After the mother code length N is determined, a construction process of the polar code, that is, a selection process of the set A, determines performance of the polar code. The construction process of the polar code is generally: determining, based on the mother code length N, that there are N polarized subchannels in total, respectively corresponding to N rows of the encoding matrix; using indexes of first K polarized subchannels with relatively high reliability as elements of the set A when rate matching is not considered; and using indexes corresponding to remaining (N−K) polarized subchannels as elements of the index set $A^c$ of the frozen bits. The set A determines positions of information bits, and the set $A^c$ determines positions of the frozen bits. Sequence numbers of the polarized subchannels are position indexes of the information bits or the frozen bits, that is, position indexes in $$u_1^N.$$

When rate matching is considered, puncturing or shortening is mainly considered, and N−E polarized subchannels that need to be punctured or shortened (that is, deleted) are generally first determined. Herein, E is a target code length, that is, a bit sequence length after rate matching. Herein, the selected N-E polarized subchannels are used to place frozen bits. In a 5G new radio (NR) standard, for a puncturing case, some so-called pre-frozen polarized subchannels are additionally determined, and are also used to place frozen bits. Herein, a quantity of pre-frozen polarized subchannels may be defined as P, where P is greater than or equal to 0 (P is obviously 0 in a case of shortening, and in this case, P may not need to be considered). Then, K polarized subchannels with relatively high reliability are selected from remaining E–P polarized subchannels based on reliability, and are used to place K information bits. Certainly, E–P–K subchannels with relatively low reliability may be first selected to place frozen bits, and remaining K subchannels are used to place information bits. Reliability of any one of the K polarized subchannels on which the K information bits are placed is greater than reliability of any one of the E–P–K subchannels on which the frozen bits are placed. In this application, a value of P is not limited. Even in a case of puncturing, P may be 0; and even in a case of shortening, P may be greater than 0. This does not affect implementation of technical solutions of this application. Regardless of an encoder end or a decoder end, a principle and a method for determining the K subchannels that are used to place the K information bits are the same. In addition, in the 5G NR standard, for selection of the N-E polarized subchannels, a sequence obtained after sub-block interleaving (for example, 32 sub-blocks are obtained through division) is placed in a circular buffer (which is equivalent to a rate matching sequence). If puncturing is to be performed, bits are read from an $(N-E)^{th}$ position in the circular buffer, and bits from a $0^{th}$ position to an $(N-E-1)^{th}$ position are discarded. If shortening is to be performed, bits are read from the $0^{th}$ position to an $(E-1)^{th}$ position in the circular buffer, and bits from an $E^{th}$ position to an (N–1)th position are discarded. This manner does not consider a relationship between rate matching sequences with different mother code lengths.

It should be noted that a relative relationship in reliability described herein is based on a given reliability calculation manner. Different reliability calculation manners may cause a relative relationship in reliability of the polarized subchannels to change. However, the method for selecting polarized subchannels to place information bits remains the same. Beyond the 5G NR standard, an information bit may also be considered to be placed on a polarized subchannel that is last punctured or shortened. This application does not limit a standard on which selection of polarized subchannels for placing information bits is based to the 5G NR standard.

When a transport block size (TBS) of a data channel is excessively large, a transport block needs to be segmented. The solution related to the foregoing description may be considered as an implementation solution of performing polar encoding on each segment.

FIG. 1 is a schematic diagram of a structure of a wireless communications network according to an embodiment of the present invention. FIG. 1 is merely an example, and other wireless networks that can use a segmentation method, a retransmission method, or an apparatus in the embodiments of the present invention also fall within the protection scope of the present invention.

As shown in FIG. 1, a wireless communications network 100 includes a network device 110 and a terminal 112. When the wireless communications network 100 includes a core network 102, the network device 110 may be further connected to the core network 102. The network device 110 may further communicate with an IP network 104, such as the Internet, a private IP network, or another data network. The network device provides a service for a terminal in a coverage area. For example, referring to FIG. 1, the network device 110 provides wireless access for one or more terminals 112 in a coverage area of the network device 110. In addition, there may be an overlapping area between coverage areas of network devices, for example, network devices 110 and 120. The network devices may further communicate with each other. For example, the network device 110 may communicate with the network device 120.

The network device may be a device configured to communicate with a terminal device, for example, may be an evolved NodeB (eNB or eNodeB) in an LTE system, may be a gNB in a 5G network, or may be a satellite in satellite communication, or a network side device in a future communications system. Alternatively, the network device may be a relay station, an access point, a vehicle-mounted device, or the like. In a device to device (D2D) communications system, a machine to machine (M2M) communications system, and an Internet of Vehicles system, the network device may alternatively be a terminal that functions as a base station.

The terminal may be user equipment (UE), an access terminal, a subscriber unit, a mobile station, a remote station, a remote terminal, a mobile device, a user terminal, a wireless communications device, a user agent, or a user apparatus. The access terminal may be a cellular phone, a cordless phone, a Session Initiation Protocol (SIP) phone, a wireless local loop (WLL) station, a personal digital assistant (PDA), a handheld device that has a wireless communication function, a computing device, another processing device connected to a wireless modem, a vehicle-mounted device, a wearable device, a terminal device in a future communications network, or the like.

Based on the communications system architecture shown in FIG. 1, in embodiments of this application, the polar code encoding method may be performed by the network device or the terminal. When serving as a transmit end to send data or information, the network device or the terminal may use the polar code encoding method. Correspondingly, when serving as a receive end to receive data or information, the network device or the terminal needs to determine segmentation and HARQ mechanisms based on the method described in the present invention, to perform corresponding decoding. The following describes in detail the segmentation and/or retransmission methods provided in embodiments of this application.

Figure 2:
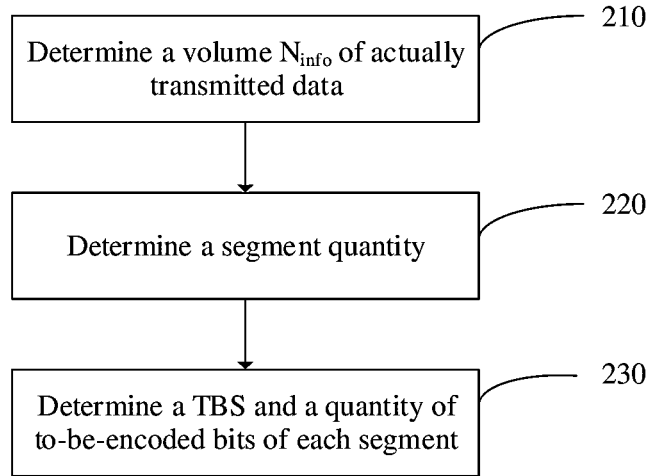
FIG. 2 is a schematic flowchart of a segmentation method according to an embodiment of this application.

Based on the communications system architecture shown in FIG. 1, as shown in FIG. 2, this application first provides a mechanism for determining and performing data segmentation.

Step 210: Determine a volume $N_{info}$ of actually transmitted data.

Based on a quantity $N_{RE}$ of resource elements scheduled by a system, a code rate (R), a modulation order (Qm), and a quantity (v) of streams, it is determined that a volume of data that may be transmitted by using an air interface is $N_{info}=N_{RE}*R*Qm*v$. It should be noted that, in actual application, $N_{info}$ may alternatively be determined in another manner. For example, in a multiple-input multiple-output system, a plurality of supported streams may support different modulation schemes. In this case, a calculation method is a sum of volumes of data that may be transmitted by the streams, instead of a product. This is not limited in this application.

Step 220: Determine a segment quantity.

It is assumed that:

$$N'_{info} = \max(TBSmin, 2^n * round((N_{info} - TBcrc)/2^n))$$

$$n = \max(n_{min}, \lfloor \log 2(N_{info} - TBcrc) \rfloor - n0) \qquad \text{(Formula 1)}$$

TBSmin refers to a minimum transport block size, which is usually 24 bits.

round is a rounding operation. In actual application, the operation may also be changed to rounding up or rounding down, which has some impact on a subsequent operation. For example, $N'_{info}$ obtained by performing rounding up is not less than $N'_{info}$ obtained by performing the round operation, and $N'_{info}$ obtained by performing the round operation is not less than $N'_{info}$ obtained by performing rounding down. In this way, in a rounding up manner, a final segment quantity is greater than or equal to a segment quantity obtained by performing the round operation; and the segment quantity obtained by performing the round operation is greater than or equal to a segment quantity obtained in a rounding down manner.

TBcrc represents a quantity of bits used for CRC check at a transport block (TB) level, and typically, may be set to a value such as 16, 24, or 32. If CRC check is not performed on a TB, TBcrc may also be 0.

n is a quantization level of a current transport block, and $n_{min}$ is a minimum quantization level of the transport block. Quantization herein refers to a quantity of data units included in the transport block. Generally, $n_{min}=3$, indicating that one data unit includes 23 bits, that is, 8 bits, which is equivalent to one byte. If n=3, the quantization may refer to a quantity of bytes included in the transport block. n0 is a quantized adjustment value, and typically, may be set to a value such as 4, 5, or 6.

$\lfloor \ \rfloor$ is a rounding down operation, and herein, may also be changed to the round operation or rounding up, and impact on the system is mainly that $N'_{info}$ is caused to become larger or smaller.

log 2( ) represents a base-2 logarithm operation.

It may be learned from the foregoing description that $N'_{info}$ may be considered as $N_{info}$ that is adjusted based on the quantization level, to ensure that a quantity of included data units is an integer.

It is assumed that K_threshold is a preset segmentation threshold. In this case, a value of the segment quantity C is:

$$C = \begin{cases} \lceil N'_{info} + TBcrc)/K\_thresdhold \rceil & N'_{info} > K\_threshold \\ 1 & else \end{cases} \qquad \text{(Formula 2)}$$

Herein, $\lceil \ \rceil$ is a rounding up operation, and it should be noted that only the rounding up operation can be performed herein, but not the round operation or the rounding down operation; and else represents others. In addition, ">" may also be "≥" indicating that segmentation is also performed when $N'_{info}$ is equal to the threshold value. In specific application, whether to perform segmentation may be determined based on a requirement. This is not limited herein.

$$K\_threshold = Kcb - CBcrc \qquad \text{(Formula 3)}$$

Kcb is a maximum quantity of to-be-encoded bits that can be included in a channel encoding code block, and also includes a quantity CBcrc of CRC bits at a code block (CB) level. A typical value of CBcrc is a value such as 6, 8, 16, 24, or 32. A commonly used method is:

$$K_{cb} = \lceil (Nmax*R)/2^{n1} \rceil * 2^{n1} \qquad \text{(Formula 4)}$$

Herein, Nmax is a maximum quantity of bits that may be transmitted at a time. When the method is applied to polar code encoding, a value of Nmax is exactly equal to a maximum mother code length supported during initial transmission. $2^{n1}$ represents a quantization unit, and may correspond to the foregoing minimum quantization level. For example, n1=3, that is, quantization is performed in a unit of byte. Therefore, $2^{n1}$ may also be directly written as 8. Rounding up in the formula may also be replaced with the round operation or rounding down. It may be learned from the formula that larger Kcb means a smaller probability of segmentation or a smaller quantity of segments.

Step 230: Determine a TBS and a quantity of to-be-encoded bits of each segment.

After the segment quantity C is determined, an actual TBS to be transmitted may be obtained as follows:

$$TBS = 2^{n2} * C * \lceil (N'_{info} + TBcrc)/(2^{n2} * C) \rceil - TBcrc \qquad \text{(Formula 5)}$$

It may be learned from the formula that the TBS may be considered as a result of further adjusting $N'_{info}$ based on a segmentation situation. It should be noted that the TBS herein is a size of a data payload for which CRC check is not performed yet. $2^{n2}$ represents a quantization unit, and generally, n2=n1. Therefore, n2 may also be set to 3, and $2^{n2}$ may also be directly written as 8.

Correspondingly, a quantity K of to-be-encoded bits included in each segment is:

$$K = \begin{cases} \lceil (TBS + TBcrc)/C \rceil + CBcrc & C > 1 \\ TBS + TBcrc & C = 1 \end{cases} \qquad \text{(Formula 6)}$$

It should be noted that, when C=1, because there is no segmentation, that is, a TB is equal to a CB, CRC check needs to be performed only once. CRC at a TB level is used in the formula 6, and in actual application, may also be changed to CBcrc based on a regulation, as long as the formula is unified between a transmit end and a receive end.

Although in FIG. 2, segmentation determining and TBS calculation are performed by using a plurality of formulas in a plurality of separate steps, in actual application, some or even all formulas and steps may be combined, or a sequence of calculation may be changed without affecting a final result.

The method shown in FIG. 2 is based on a case in which the TBS is not determined yet. If a value of the TBS is clearly known, it is easier to determine whether to perform segmentation. The segment quantity C may be:

$$C = \begin{cases} \lceil (TBS + TBcrc)/K\_threshold \rceil & TBS > K\_threshold \\ 1 & else \end{cases} \qquad \text{(Formula 7)}$$

Similarly, ">" may also be "≥", indicating that segmentation is also performed when the TBS is equal to the threshold value. This is not limited herein.

The quantity K of to-be-encoded bits included in each segment may also be calculated by using the formula 6.

It should be noted that the foregoing segmentation manner is applicable to a plurality of types of channel encoding, including polar encoding and LDPC encoding.

Because processing principles and methods of each segment of segmented transport block are the same, the following embodiments are all described based on a case in which C=1, and related CRC also refers to CRC at the CB level. That is, after obtaining a transport block, the transmit end performs segmentation, then encodes K to-be-encoded bits in each segment to obtain an encoded sequence or a retransmitted sequence, and then sends the encoded sequence or the retransmitted sequence. The receive end receives a to-be-decoded transport block, in which each corresponding segment is a received signal including information of K to-be-encoded bits (that is, the encoded sequence or the retransmitted sequence); and performs corresponding decoding.

In this case, when a polar code is used as a channel encoding scheme of a data channel, if an error occurs in initial transmission, how is retransmission performed? A HARQ solution of the polar code is not specified in an existing 3GPP protocol. Therefore, on one hand, an existing 3GPP technology may be considered to be reused for an initial transmission solution of the data channel, including selection of a rate matching solution and a principle for selecting information bits. However, because a transport block supported by the data channel is relatively large, Nmax needs to be increased, and a corresponding reliability ordering sequence needs to be designed. However, this does not fall within the scope of the present invention, and therefore is not limited. On the other hand, a retransmission method is first provided herein. That is, when an error occurs in initial transmission, an incremental redundancy (IR) manner is used for first retransmission, and a chase combining (CC) manner is used for subsequent retransmission. This manner may not only use an advantage of the IR manner but also simplify a design, and is a relatively good compromise.

As shown in FIG. 3, an embodiment of a retransmission method of how to construct a redundancy version (RV) for HARQ transmission is disclosed.

Operation 310: A transmit end performs polar encoding on an obtained to-be-encoded bit sequence to obtain an encoded first bit sequence, and obtains an initial transmission version RV0 based on a rate matching manner.

A conventional technology may be used in this step. For example, based on a 3GPP standard, the encoded first bit sequence is written into a first circular buffer after being interleaved. When an initial transmission code rate R0 is less than or equal to $7/16$, a rate matching manner of puncturing is used. In this case, the RV0 is last E0 bits in the first circular buffer. When R0 is greater than $7/16$, a rate matching manner of shortening is used. In this case, the RV0 is first E0 bits in the first circular buffer. R0=K/E0, and E0 is a quantity of bits actually transmitted by using an air interface during initial transmission.

Operation 320: Determine a length E1 of a retransmission version RV1.

E1 is a quantity of bits that may be transmitted by using an air interface during first retransmission. A specific value calculation method is the same as a method for determining E0.

Operation 330: Determine the RV1 based on the initial transmission code rate R0 and a rate matching manner for retransmission.

When R0 is less than or equal to a preset code rate threshold R_threshold (that is, R0<R_threshold), the RV1 version whose length is E1 may be directly read from the first circular buffer for initial transmission. R_threshold may be any value between $1/4$ and $1/2$, for example, $1/4$, $3/8$, $7/16$, $15/32$, or $1/2$. The RV1 may be first E1 bits in the first circular buffer, or E1 bits that are sequentially read clockwise from a start point of the first circular buffer. In this method, bits that are not transmitted during initial transmission may be preferentially put into the RV1. Alternatively, how to read the RV1 from the first circular buffer may be determined based on the rate matching manner for retransmission and in a manner similar to the manner for initial transmission. This is not limited herein.

When R0 is greater than R_threshold (that is, R0>R_threshold), an encoded second bit sequence may be generated in an IR manner, and rate matching may be performed based on one or more of parameters including but not limited to a code rate, Nmax, a mother code length N0 used for initial transmission encoding, E0, and E1, to obtain the RV1.

If E1≥N0, the rate matching manner for retransmission is repetition. Otherwise, when R0 is less than or equal to a preset code rate threshold R_threshold_initial, the rate matching manner for retransmission is puncturing; and when R0 is greater than the preset code rate threshold R_threshold_initial, the rate matching manner for retransmission is shortening. R_threshold_initial is a threshold for determining the rate matching manner during initial transmission. In a 5G NR standard, a value of R_threshold_initial is $7/16$. Certainly, the value of R_threshold_initial may alternatively be another preset value. For simplicity, it may be assumed that R_threshold_initial=R_threshold. Certainly, when R0=R_threshold, a manner the same as the manner used when R0>R_threshold may also be used. This is determined by an agreement between the transmit end and a receive end.

In a possible design, if E1≥N0, the rate matching manner for retransmission is repetition. Otherwise, when R0 is greater than the preset code rate threshold R_threshold_initial, and the length E1 of the retransmission version RV1 is less than the length E0 of the initial transmission version RV0, the rate matching manner for retransmission may be shortening, puncturing, or a combination of shortening and puncturing.

Optionally, when the rate matching manner for initial transmission is shortening, rate matching bits during retransmission include two parts: punctured bits and shortened bits. A quantity and positions of shortened bits are the same as a quantity and positions of shortened bits during rate matching for initial transmission. A quantity of punctured bits is E0-E1, and positions of the punctured bits may be determined based on a puncturing manner of NR rate matching.

Optionally, when the rate matching manner for initial transmission is repetition, rate matching bits during retransmission include punctured bits. A quantity of punctured bits is N0-E1, and positions of the punctured bits may be determined based on a puncturing manner of NR rate matching.

Optionally, after the positions of the punctured bits are determined, some bit positions may be further pre-frozen. However, different from a manner of determining pre-frozen bit positions in an existing NR protocol, this application proposes a new method for determining pre-frozen bit positions, which is as follows:

1. If a quantity $P_i$ of punctured bits in an $i^{th}$ sub-block exceeds a preset value, another polarized subchannel corresponding to the sub-block is determined as a pre-frozen polarized subchannel, where the preset value may be a constant, for example, 0, 1, 10, or 16.

2. Alternatively, if a quantity $P_i$ of punctured bits in an $i^{th}$ sub-block exceeds a preset proportion of a total quantity of polarized subchannels corresponding to the sub-block, another polarized subchannel corresponding to the sub-block is determined as a pre-frozen polarized subchannel, where the preset proportion may be $1/16$, $1/8$, $1/4$, $1/2$, or the like.

Certainly, if all polarized subchannels corresponding to a sub-block are punctured, there is no pre-frozen polarized subchannel in the sub-block.

In an embodiment shown in FIG. 4, the following operations may be performed:

Operation 330a: Obtain a subchannel set Q1, where Q1 includes K elements, and the elements are sequence numbers of K subchannels used to place K to-be-encoded bits during initial transmission, and may be obtained in operation 310.

Operation 330b: Add N0 to all subchannel sequence numbers in Q1, to obtain a subchannel set Q2, where Q2(i)=Q1(i)+N0, and i=0, 1, . . . , and K−1. Without loss of generality, in this application, an example in which the subchannel sequence numbers are numbered starting from 0 is used for description. If the subchannel sequence numbers are numbered starting from 1, 1 may be correspondingly added to the subchannel sequence numbers. Details are not described.

Operation 330c: Determine, based on a reliability ordering sequence whose length is N1=2*N0 and the rate matching manner for retransmission, a subchannel set Q3 of K1 to-be-encoded bits when a mother code length is N1. An element in Q3 meets: Q3(i)<N0, or Q3(i)∈Q2, where i=0, 1, . . . , and K1−1. Herein, K1=K+K_adjust, and K_adjust is a newly added to-be-encoded bit. A value of K_adjust is 0 or CBcrc1. CBcrc1 may be 0 or not 0. A reason why CBcrc1 is not 0 is that some CRC check may need to be performed again during retransmission to improve retransmission reliability. A value of CBcrc1 may be determined in any one of the following manners:

Manner 1: Set the value of CBcrc1 to 0.

Manner 2: Determine the value of CBcrc1 based on a condition. When N0=4096, the value of CBcrc1 is set to a first preset value, for example, 6, 8, 16, or 24; or otherwise, the value of CBcrc1 is set to 0.

Manner 3: Determine the value of CBcrc1 based on a condition. When N0=4096, and E1>=Alpha*E0, the value of CBcrc1 is set to a first preset value, and the first preset value may be set to, for example, 6, 8, 16, or 24; or otherwise, the value of CBcrc1 is set to 0. A value of Alpha may be any value in an interval [½, 1], for example, ½, ¾, ⅞, or 1.

CBcrc1 may use the same manner as CRC for initial transmission, or may use a shorter CRC polynomial. For example, 24-bit CRC is used for initial transmission, and 8-bit CRC is used for retransmission (that is, CBcrc1=8).

Operation 330d: Determine an extended to-be-encoded bit set Qext, where an element in Qext is an element that is in Q3 and that is less than N0.

When the value of CBcrc1 is determined in the manner 2, and the value of CBcrc1 is not 0, the following operation 330e0 (not shown in the figure) further needs to be performed. It should be noted that, when CBcrc1 is 0, operation 330e0 certainly may also be performed, but a result is not affected. Therefore, it is generally recommended that operation 330e0 be not performed when CBcrc1 is 0.

Operation 330e0:

When |Qchk|=0 (that is, Qext=CBcrc1), adjust the value of CBcrc1 to 0; or otherwise, do not adjust the value of CBcrc1.

Optionally, when |Qchk|≠0, the value of CBcrc1 may be further determined and adjusted, for example:

0<|Qchk|<=Chk_threshold (Chk_threshold is a preset threshold value, and a typical value may be 10, 50, or the like). In this case, the value of CBcrc1 is adjusted to a second preset value, and the second preset value is less than the first preset value. For example, the value of CBcrc1 is adjusted from 8 to 6, or to 3 or the like.

Operation 330e: Determine a replicated bit set Qchk=Q2\ (Q3\Qext), where "\" represents a difference operation of sets, that is, A\B represents all elements that belong to A but do not belong to B.

Figure 5:
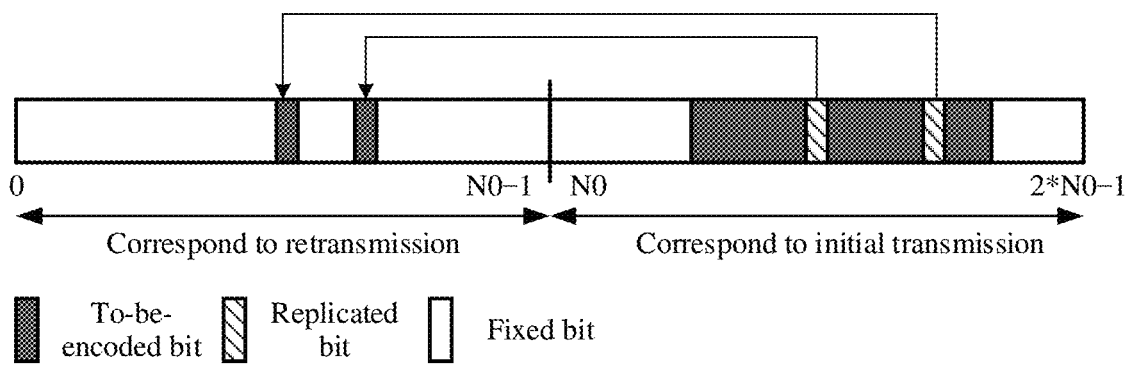
FIG. 5 is a schematic diagram of bit replication according to an embodiment of this application.

Operation 330f: Select bit values on some or all subchannels in Qchk, and replicate the bit values to corresponding subchannels in Qext one by one. FIG. 5 shows a schematic diagram: CBcrc1 subchannels are first selected from Qext to place CRC bits (this step is omitted when CBcrc1=0), and bits of |Qext|−CBcrc1 subchannels are selected from Qchk and replicated to remaining |Qext|−CBcrc1 subchannels in Qext. The CBcrc1 CRC bits are used to perform CRC check on the |Qext|−CBcrc1 replicated bits, where an operation JAI represents obtaining of a quantity of elements in a set A. A method for first selecting CBcrc1 subchannels from Qext and a method for selecting |Qext|−CBcrc1 subchannels from Qchk may be sequentially selecting from front to back or from back to front in a natural order, or may be sequentially selecting based on reliability of the subchannels from front to back or from back to front. The methods may be the same or different, and this is not limited herein. When Qext is relatively large, Qchk is relatively small, and |Qchk| positions need to be selected from Qext to place replicated bits, a selection method is similar, that is, may be sequentially selecting from front to back or from back to front in a natural order, or may be sequentially selecting based on reliability of the subchannels from front to back or from back to front. Regardless of the selection method, the transmit end and the receive end only need to agree on a unified method.

Operation 330g: Perform polar code retransmission encoding with a mother code length of N1 on the K to-be-encoded bits based on the determined positions and values, to obtain a polar-encoded second bit sequence; and then obtain the RV1 from first N0 bits of the second bit sequence based on the rate matching manner for retransmission. A manner of obtaining the RV1 from the first N0 bits may be the same as the manner of obtaining the RV0 from the first bit sequence.

To better describe the foregoing steps, a specific example is given below.

It is assumed that N0=64, and N1=128. A reliability ordering sequence in a 3GPP 5G NR standard may be directly used:

N0=64: S0=[0, 1, 2, 4, 8, 16, 32, 3, 5, 9, 6, 17, 10, 18, 12, 33, 20, 34, 24, 36, 7, 11, 40, 19, 13, 48, 14, 21, 35, 26, 37, 25, 22, 38, 41, 28, 42, 49, 44, 50, 15, 52, 23, 56, 27, 39, 29, 43, 30, 45, 51, 46, 53, 54, 57, 58, 60, 31, 47, 55, 59, 61, 62, 63].

N1=128: S1=[0, 1, 2, 4, 8, 16, 32, 3, 5, 64, 9, 6, 17, 10, 18, 12, 33, 65, 20, 34, 24, 36, 7, 66, 11, 40, 68, 19, 13, 48, 14, 72, 21, 35, 26, 80, 37, 25, 22, 38, 96, 67, 41, 28, 69, 42, 49, 74, 70, 44, 81, 50, 73, 15, 52, 23, 76, 82, 56, 27, 97, 39, 84, 29, 43, 98, 88, 30, 71, 45, 100, 51, 46, 75, 104, 53, 77, 54, 83, 57, 112, 78, 85, 58, 99, 86, 60, 89, 101, 31, 90, 102, 105, 92, 47, 106, 55, 113, 79, 108, 59, 114, 87, 116, 61, 91, 120, 62, 103, 93, 107, 94, 109, 115, 110, 117, 118, 121, 122, 63, 124, 95, 111, 119, 123, 125, 126, 127].

It is assumed that E0=60, and K=50. Therefore, R=⅚, and R_threshold=7/16. Therefore, the RV1 needs to be constructed in the IR manner, and the rate matching manner of shortening is used for initial transmission.

Q1=[67    10    11 12    13    14    15    17    18
19 20 21 22 23 24 25 26 27 28 29 30 31    33    34 35 36    37    38    39
40 41 42 43 44 45 46 47 48 49 50 51 52 53 54 55 56
57 58 59].

Correspondingly:

Q2=[70 71 74 75 76 77 78 79 81 82 83 84 85 86 87 88 89 90 91 92 93 94 95 97 98 99 100 101 102 103 104 105 106 107 108 109 110 111 112 113 114 115 116 117 118 119 120 121 122 123].

It is assumed that E1 is exactly equal to E0, and is also equal to 60. The rate matching manner of shortening is also used in subchannels 64 to 127. Therefore, all shortened subchannels are $Q_{RM}$=[60 61 62 63 124 125 126 127].

When K_adjust is 0:

Q3=[31 464751 53 5455 5758597577787983 85 8687899091 9293 949599 100 101 102 103 104 105 106 107 108 109 110 111 112 113 114 115 116 117 118 119 120 121 122 123].

Qext=[31 46 47 51 53 54 55 57 58 59].

Qchk=[70 71 74 76 81 82 84 88 97 98].

If CBcrc1=0, bits of subchannels in Qchk may be sequentially replicated to Qext in the foregoing order. Alternatively, a bit of a subchannel with a larger sequence number in Qchk may be replicated to a subchannel with a smaller sequence number in Qext under the premise of considering a decoding order. That is, a bit of a subchannel 98 is replicated to a subchannel 31, a bit of a subchannel 97 is replicated to a subchannel 46, and so on, and a bit of a subchannel 70 is replicated to a subchannel 59.

If CBcrc1=8, eight subchannels other than 31 and 46 in Qext may be used to carry newly added CRC bits. Values of subchannels 70 and 71 selected from Qchk may be respectively replicated to subchannels 46 and 31. The eight CRC bits are used to perform CRC check on the two bits. It may be learned that, in this case, the eight CRC bits are obviously redundant. Therefore, in actual application, there is another possibility that a CRC bit does not need to be added when a quantity of to-be-encoded bits is in a first interval, and a CRC bit needs to be added when the quantity of to-be-encoded bits is in a second interval. Alternatively, a relatively small quantity of CRC bits are added when the quantity of to-be-encoded bits is in a third interval, and a relatively large quantity of CRC bits are added when the quantity of to-be-encoded bits is in a fourth interval. Specific interval division, whether to add CRC bits, and how many CRC bits to be added only need to be unified between the transmit end and the receive end.

When K_adjust is 8, Q3 may be:

Q3=[293031 4345464751 53 5455 57585971 7577787983 848586878889 90 91 92 93 94 95 98 99 100 101 102 103 104 105 106 107 108 109 110 111 112 113 114 115 116 117 118 119 120 121 122 123].

Correspondingly, corresponding Q2, Qext, and Qchk are:

Q2=[70 71 74 75 76 77 78 79 81 82 83 84 85 86 87 88 89 90 91 92 93 94 95 97 98 99 100 101 102 103 104 105 106 107 108 109 110 111 112 113 114 115 116 117 118 119 120 121 122 123].

Qext=[29 30 31 43 45 46 47 51 53 54 55 57 58 59].

Qchk=[70 74 76 81 82 97].

Eight subchannels 47, 51, 53, 54, 55, 57, 58, and 59 in Qext may be used to carry newly added CRC bits. Bits of six subchannels in Qchk are replicated to six subchannels 29, 30, 31, 43, 45, and 46. A bit of a subchannel 70 is replicated to the subchannel 46, a bit of a subchannel 74 is replicated to the subchannel 45, and so on, and a bit of a subchannel 97 is replicated to the subchannel 29.

It may be learned that, even for the same CBcrc1, different values of K_adjust affect a final result. Therefore, K_adjust needs to be unified between the transmit end and the receive end.

Operation 340: Input the RV0 and the RV1 in a cascading manner into a second circular buffer.

Operation 350: Perform further retransmission.

If the RV1 sent in the first retransmission is correctly decoded, operations 340 and 350 do not need to be performed, and therefore are indicated by dashed lines. If the RV1 sent in the first retransmission still fails to be correctly decoded, further retransmission needs to be performed. In this case, CC retransmission is used as described above. In this case, the transmit end may directly read a corresponding version from the second circular buffer and send the version. For example, bits of $x^{th}$ transmission may be Ex bits (a quantity of bits transmitted by using an air interface) that are read from a first bit after a last bit position of previous transmission, or may be Ex bits that are read from a first bit after a last bit position of an RV version (the RV0 or the RV1) used in previous transmission, where x is greater than 1.

In actual application, to simplify an operation, step 330 (a solution 1 of step 330) of determining the RV1 may alternatively be implemented in another manner.

Solution 2 of step 330: When the initial transmission code rate R0 is less than or equal to the preset code rate threshold R_threshold (that is, R0<R_threshold, and a value of R_threshold may be the same as the foregoing value example, for example, $7/16$), the RV1 includes bits that are at a mod(N0−(E0+E1), N0)$^{th}$ position to a mod(N0−E0−1, N0)$^{th}$ position in the first circular buffer and that are arranged in an order in which the bits are arranged in the first circular buffer, where mod indicates a modulo operation. It should be noted that position numbers herein start from 0. Alternatively, when the initial transmission code rate R0 is greater than R_threshold, the RV1 includes bits that are at a mod(min(E0, N0)−E1, min(E0, N0))$^{th}$ position to a mod(min(E0, N0)−1, min(E0, N0))$^{th}$ position in the first circular buffer and that are arranged in an order in which the bits are arranged in the first circular buffer.

It may be learned that, in the solution 2 of step 330, a bit that does not participate in transmission during initial transmission is preferentially considered to be transmitted during retransmission, and a procedure is simplified. Therefore, in practice, either the retransmission manner shown in the solution 1 of step 330 or the retransmission manner shown in the solution 2 of step 330 may be used. Particularly, the two manners may be simultaneously supported to meet different requirements. In this case, a specific retransmission manner may be explicitly or implicitly notified by using downlink control signaling DCI, radio resource control RRC signaling, or other control signaling. In this way, the receive end and the transmit end uniformly determine whether a to-be-used retransmission manner is the solution 1 of step 330 or the solution 2 of step 330.

Regardless of initial transmission or retransmission, to overcome channel impact, a channel interleaving operation may be further performed on to-be-sent bits after rate matching. The to-be-sent bits may be input into a channel interleaver, and then the interleaved bits may be sent. Generally, the interleaver may be selected as a row-column interleaver, and the bits are written by row and read by column, or written by column and read by row. To make the to-be-sent bits more evenly distributed in the interleaver and ensure random performance, a row quantity of the row-column interleaver may be 14. In this case, a column quantity of the $x^{th}$ transmission is ⌈Ex/14⌉, where x is an integer greater than or equal to 0, x=0 indicates initial transmission, and x being another value indicates $x^{th}$ retransmission.

Although in FIG. 3, the RV1 is determined by performing a plurality of separate steps, in actual application, some steps may be combined, or a sequence of calculation may be changed without affecting a final result.

The foregoing description of the embodiment in FIG. 3 is directed against the transmit end. However, actually, an operation of the receive end is quite similar. A difference lies in that, in operation 310, decoding is performed instead of encoding, to obtain a decoded first bit sequence. For the others, methods and principles for determining the RV0 and the RV1 are completely the same except that the RV0 and the RV1 are used for IR combining or CC combining in each time of retransmission, to obtain and output a decoding result. Certainly, sending in operation 350 should also be correspondingly changed to receiving. Therefore, details are not described.

Figure 6:
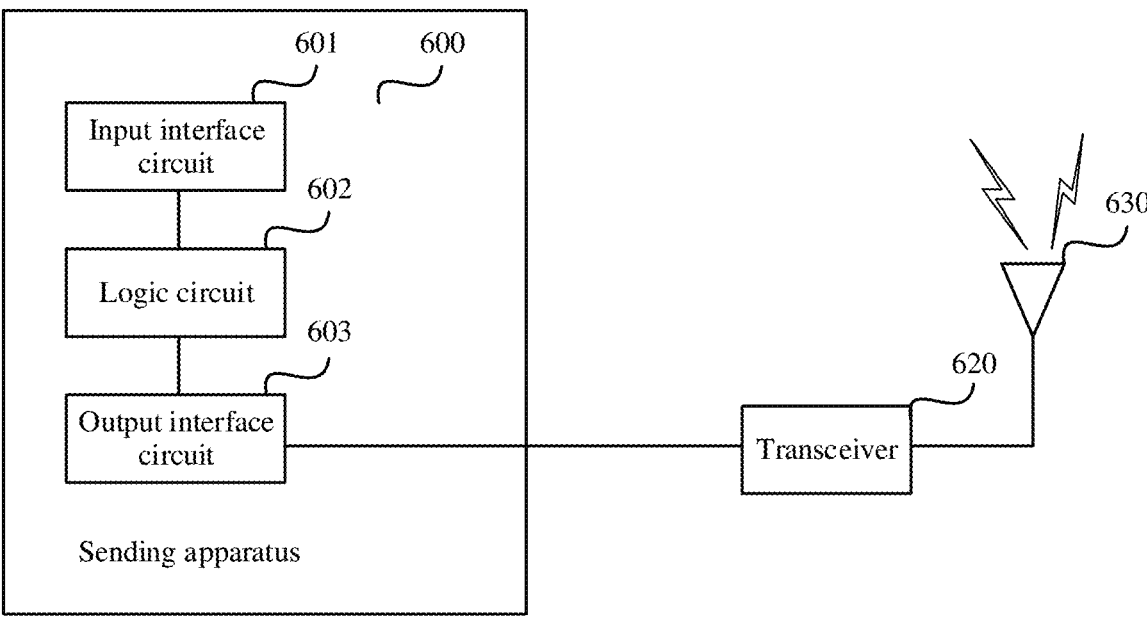
FIG. 6 is a schematic diagram 1 of a structure of a sending apparatus according to an embodiment of this application.

As shown in FIG. 6, an embodiment of this application further provides a sending apparatus 600. Some or all of the segmentation method shown in FIG. 2 and the retransmission method shown in FIG. 3 and FIG. 4 may be implemented by hardware, or may be implemented by software.

For the sending apparatus 600, based on a same inventive concept of the segmentation and retransmission methods shown in FIG. 2 to FIG. 5, the sending apparatus 600 is configured to perform the segmentation and retransmission methods shown in FIG. 2 to FIG. 5. When some or all of the segmentation and retransmission methods are implemented by hardware, the sending apparatus 600 includes: an input interface circuit 601, configured to obtain a to-be-transmitted transport block; a logic circuit 602, configured to perform the segmentation and retransmission methods shown in FIG. 2 to FIG. 5, where for details, refer to the description in the foregoing method embodiments, and details are not described herein; and an output interface circuit 603, configured to output an encoded sequence or a retransmitted sequence. Further, the encoded sequence or the retransmitted sequence is output to a transceiver 620, and the transceiver 620 performs corresponding processing (including but not limited to processing such as digital-to-analog conversion and/or frequency conversion) on the encoded sequence or the retransmitted sequence, and then sends the encoded sequence or the retransmitted sequence by using an antenna 630. Optionally, during specific implementation, the sending apparatus 600 may be a chip or an integrated circuit.

Figure 7:
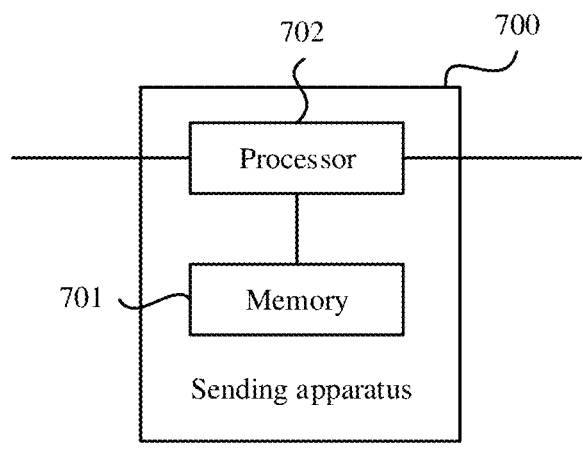
FIG. 7 is a schematic diagram 2 of a structure of a sending apparatus according to an embodiment of this application.

Optionally, when some or all of the segmentation and retransmission methods in the foregoing embodiments are implemented by software, as shown in FIG. 7, a sending apparatus 700 includes: a memory 701, configured to store a program; and a processor 702, configured to execute the program stored in the memory 701. When the program is executed, the sending apparatus 700 may implement the segmentation and retransmission methods provided in the foregoing embodiments.

Optionally, the memory 701 may be a physically independent unit, or may be integrated with the processor 702.

Optionally, when some or all of the segmentation and retransmission methods in the foregoing embodiments are implemented by software, the sending apparatus 700 may alternatively include only the processor 702. The memory 701 configured to store the program is located outside the sending apparatus 700. The processor 702 is connected to the memory 701 by using a circuit/wire, and is configured to read and execute the program stored in the memory 701.

Figure 8:
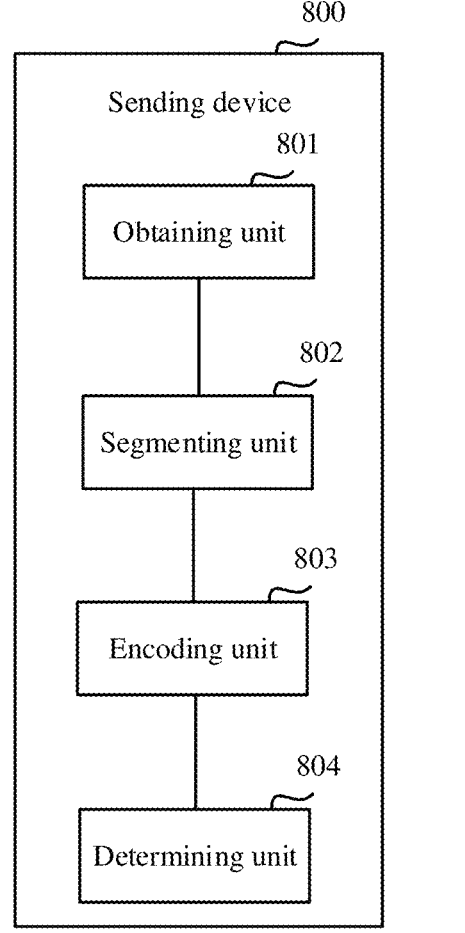
FIG. 8 is a schematic diagram of a sending device according to an embodiment of this application.

Based on the segmentation and retransmission methods shown in FIG. 2 to FIG. 5, and as shown in FIG. 8, an embodiment of this application further provides a sending device 800, configured to perform the segmentation and retransmission methods shown in FIG. 2 to FIG. 5. The sending device 800 includes:

an obtaining unit 801, configured to obtain a to-be-transmitted transport block;

a segmenting unit 802, configured to segment the to-be-transmitted transport block based on the segmentation method in the embodiment shown in FIG. 2;

an encoding unit 803, configured to perform encoding or retransmission encoding on each segment of segmented transport block; and a determining unit 804, configured to determine an RV0 version and an RV1 version based on the retransmission method in the embodiments shown in FIG. 3 to FIG. 5.

Corresponding to the transmit end, an apparatus at a receive end may also be similarly designed.

Figure 9:
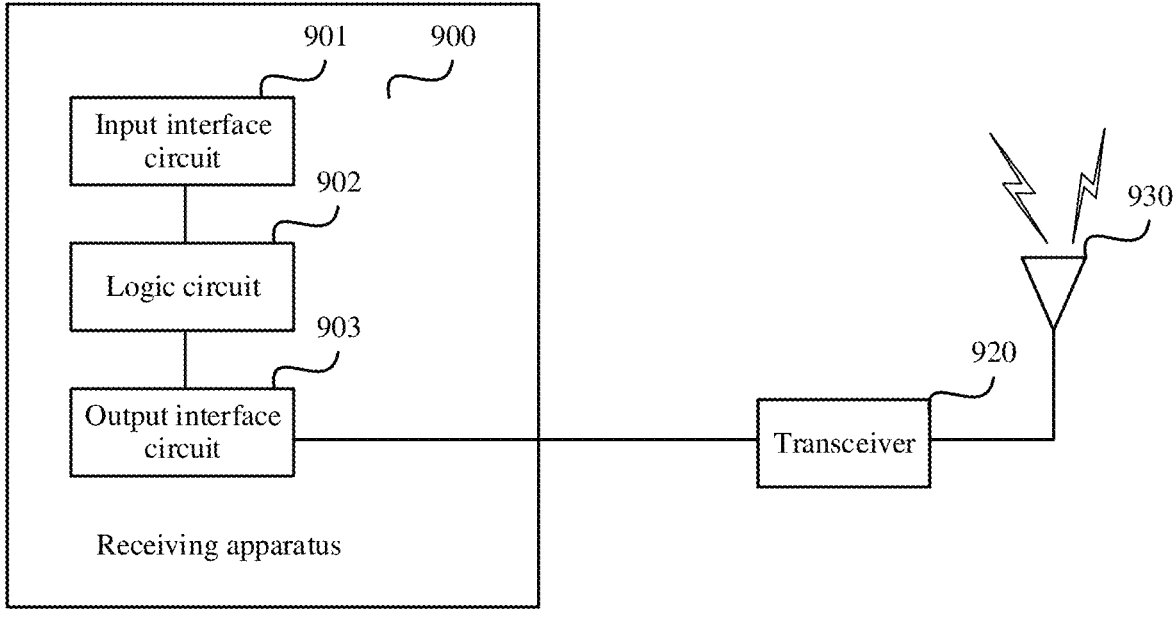
FIG. 9 is a schematic diagram 1 of a structure of a receiving apparatus according to an embodiment of this application.

As shown in FIG. 9, a receiving apparatus 900 includes: an input interface circuit 901, configured to input a received signal; a logic circuit 902, configured to perform the foregoing segmentation and retransmission methods for decoding, to obtain a decoding result; and an output interface circuit 903, configured to output the decoding result. The receiving apparatus 900 may further include a transceiver 920 that obtains the received signal by using an antenna 930. During specific implementation, the receiving apparatus 900 may be a chip or an integrated circuit.

Figure 10:
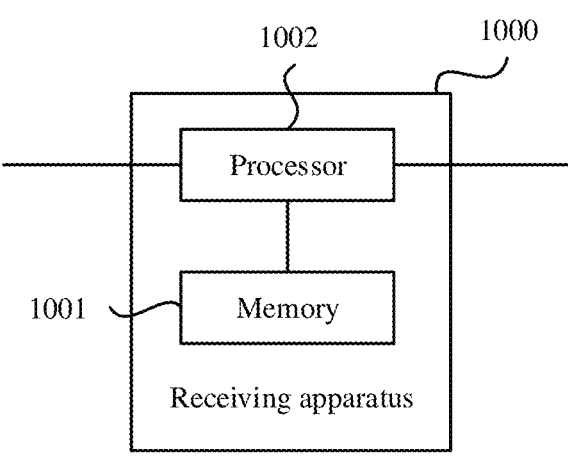
FIG. 10 is a schematic diagram 2 of a structure of a receiving apparatus according to an embodiment of this application.

Optionally, when some or all of the segmentation and retransmission methods in the foregoing embodiments are implemented by software, as shown in FIG. 10, a receiving apparatus 1000 includes: a memory 1001, configured to store a program; and a processor 1002, configured to execute the program stored in the memory 1001. When the program is executed, the receiving apparatus 1000 may implement the segmentation and retransmission methods provided in the foregoing embodiments.

Optionally, the memory 1001 may be a physically independent unit, or may be integrated with the processor 1002.

Optionally, when some or all of the segmentation and retransmission methods in the foregoing embodiments are implemented by software, the receiving apparatus 1000 may alternatively include only the processor 1002. The memory 1001 configured to store the program is located outside the receiving apparatus 1000. The processor 1002 is connected to the memory 1001 by using a circuit/wire, and is configured to read and execute the program stored in the memory 1001.

The processor 702 and/or the processor 1002 may be a central processing unit (CPU), a network processor (NP), or a combination of a CPU and an NP.

The processor 702 and/or the processor 1002 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory in the foregoing embodiment may include a volatile memory, for example, a random-access memory (RAM); or include a non-volatile memory, for example, a flash memory, a hard disk drive (HDD), or a solid-state drive (SSD); or include a combination of the foregoing types of memories.

Figure 11:
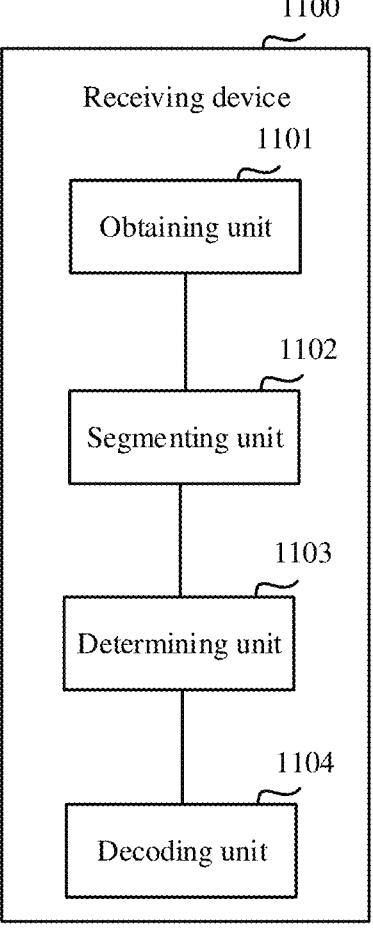
FIG. 11 is a schematic diagram of a receiving device according to an embodiment of this application.

Based on the foregoing segmentation and retransmission methods, and as shown in FIG. 11, an embodiment of this application further provides a receiving device 1100. The receiving device 1100 is configured to perform the foregoing segmentation and retransmission methods. The receiving device 1100 includes:

an obtaining unit 1101, configured to obtain a received signal;

a segmenting unit 1102, configured to segment the to-be-transmitted transport block based on the segmentation method in the embodiment shown in FIG. 2;

a determining unit 1103, configured to determine an RV0 version and an RV1 version based on the retransmission method in the embodiments shown in FIG. 3 to FIG. 5; and a decoding unit 1104, configured to decode each received segment of transport block.

An embodiment of this application further provides a computer storage medium, which stores computer program instructions. When the computer program instructions are executed by a computer, the foregoing segmentation and retransmission methods are performed.

An embodiment of this application further provides a computer program product including instructions. When the instructions are run on a computer, the foregoing segmentation and retransmission methods are performed.

A person skilled in the art should understand that embodiments of this application may be provided as a method, a system, or a computer program product. Therefore, this application may use a form of a hardware-only embodiment, a software-only embodiment, or an embodiment with a combination of software and hardware. In addition, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to embodiments of this application. It should be understood that computer program instructions may be used to implement each process and/or each block in the flowcharts and/or the block diagrams and a combination of a process and/or a block in the flowcharts and/or the block diagrams. The computer program instructions may be provided for a general-purpose computer, a dedicated computer, an embedded processor, or a processor of another programmable data processing device to generate a machine, so that the instructions executed by the computer or the processor of the another programmable data processing device generate an apparatus for implementing a specific function in one or more procedures in the flowcharts and/or in one or more blocks in the block diagrams.

The computer program instructions may alternatively be stored in a computer-readable memory that can indicate a computer or another programmable data processing device to work in a specific manner, so that the instructions stored in the computer-readable memory generate an artifact that includes an instruction apparatus. The instruction apparatus implements a specific function in one or more procedures in the flowcharts and/or in one or more blocks in the block diagrams.

The computer program instructions may alternatively be loaded onto a computer or another programmable data processing device, so that a series of operations and steps are performed on the computer or the another programmable device, so that computer-implemented processing is generated. Therefore, the instructions executed on the computer or the another programmable device provide steps for implementing a specific function in one or more procedures in the flowcharts and/or in one or more blocks in the block diagrams.

In addition to embodiments of this application, a person skilled in the art may make other changes and modifications to the embodiments once they learn of a basic creative concept. Therefore, the following claims are intended to be construed as to cover the embodiments and all changes and modifications falling within the scope of this application.

Clearly, persons skilled in the art can make various modifications and variations to embodiments of this application without departing from the scope of embodiments of this application. In this case, this application is intended to cover these modifications and variations provided that they fall within the scope of protection defined by the following claims and their equivalent technologies.

What is claimed is:

1. A retransmission method, comprising:

obtaining, by a sending apparatus, a to-be-encoded bit sequence comprising K to-be-encoded bits, wherein K is a positive integer;

performing polar encoding on the to-be-encoded sequence to obtain an encoded first bit sequence, wherein a length of the first bit sequence is N0;

determining an initial transmission version RV0;

determining a length E1 of a retransmission version RV1;

determining the retransmission version RV1 based on an initial transmission code rate R0; and sending the RV1, wherein an incremental redundancy (IR) manner is used for first retransmission, and a chase combining (CC) manner is used for subsequent retransmission.

2. The retransmission method according to claim 1, wherein determining the retransmission version RV1 based on the initial transmission code rate R0 comprises:

in response to R0 being less than or equal to a preset code rate threshold R_threshold, determining that the RV1 is E1 bits read from a circular buffer for initial transmission; or in response to R0 being greater than R_threshold, generating an encoded second bit sequence in an incremental redundancy IR manner, and obtaining the RV1 based on the second bit sequence, wherein a length of the second bit sequence is N1, and N1=2*N0.

3. The retransmission method according to claim 2, wherein obtaining the RV1 based on the second bit sequence comprises:

obtaining a subchannel set Q1, wherein Q1 comprises K elements, and the K elements are sequence numbers of K subchannels used to place the K to-be-encoded bits during initial transmission;

obtaining a subchannel set Q2, wherein Q2(i)=Q1(i)+N0, i=0, 1, . . . , and K−1, and N0 is a mother code length of a polar code used during initial transmission;

obtaining a subchannel set Q3, wherein Q3(i)<N0, or Q3(i)∈Q2; and i=0, 1, . . . , and K−1;

determining an extended to-be-encoded bit set Qext, wherein an element in Qext is an element that is in Q3 and that is less than N0;

determining a replicated bit set Qchk=Q2\(Q3\Qext); and performing, based on Q2, Q3, Qext, and Qchk, polar code encoding with a mother code length of N1 on the K to-be-encoded bits, to obtain the second bit sequence.

4. The retransmission method according to claim 3, wherein Q3 is determined based on a reliability ordering sequence whose length is N1 and a rate matching manner for retransmission.

5. The retransmission method according to claim 3, wherein performing, based on the Q2, Q3, Qext, and Qchk, polar code encoding with the mother code length of N1 on the K to-be-encoded bits comprises:

selecting bit values on some or all subchannels in Qchk, and replicating the bit values to corresponding subchannels in Qext one by one.

6. The retransmission method according to claim 2, wherein obtaining the RV1 based on the second bit sequence comprises:

obtaining the RV1 from first N0 bits of the second bit sequence based on a rate matching manner for retransmission.

7. The retransmission method according to claim 1, wherein before obtaining, by the sending apparatus, the to-be-encoded bit sequence comprising K to-be-encoded bits, the method further comprises:

performing segmentation based on a transport block size TBS.

8. The retransmission method according to claim 7, wherein a segment quantity C of the segmentation is:

$$C = \begin{cases} \lceil (TBS + TBcrc)/K\_\text{threshold} \rceil & TBS > K\_\text{threshold} \\ 1 & \text{else} \end{cases},$$

wherein TBcrc is a quantity of cyclic redundancy check CRC bits at a transport block TB level, and K_threshold is a preset first threshold.

9. The retransmission method according to claim 8, wherein $$K = \begin{cases} \lceil (TBS + TBcrc)/C \rceil + CBcrc & C > 1 \\ TBS + TBcrc & C = 1 \end{cases}, \text{ and}$$

CBcrc is a quantity of CRC bits at a code block CB level.

10. The retransmission method according to claim 8, wherein $$TBS = 2^{n2} * C * [(N'_{info} + TBcrc)/(2^{n2} * C)] - TBcrc,$$

wherein $2^{n2}$ is a quantization unit, n2 is a positive integer, and $N'_{info}$ is obtained by adjusting, based on a quantization level, a volume $N_{info}$ of data that may be transmitted.

11. The retransmission method according to claim 10, wherein $N'_{info}$ is:

$$N'_{info} = \max(TBSmin, 2^n * \text{round}((N_{info} - TBcrc)/2^n))$$

$$n = \max(n_{min}, \lfloor \log 2(N_{info} - TBcrc) \rfloor - n0); \text{ and}$$

TBSmin is a minimum transport block size, round is a rounding operation, n is a quantization level of a to-be-transmitted transport block, $n_{min}$ is a minimum quantization level, n0 is a quantized adjustment value, and $\lfloor \ \rfloor$ is a rounding down operation.

12. The retransmission method according to claim 1, wherein the method further comprises:

inputting, by the sending apparatus, the RV0 and the RV1 in a cascading manner into a circular buffer; and performing, by the sending apparatus, retransmission based on the RV0 and the RV1.

13. A sending device, comprising:

at least one processor; and at least one non-transitory memory having instructions stored thereon that, when executed by the at least one processor, wherein cause the sending device to:

obtain a to-be-encoded bit sequence comprising K to-be-encoded bits, wherein K is a positive integer;

perform polar encoding on the to-be-encoded sequence to obtain an encoded first bit sequence, wherein a length of the first bit sequence is N0;

determine an initial transmission version RV0 and a length E1 of a retransmission version RV1;

determine the retransmission version RV1 based on an initial transmission bit rate R0; and send the RV1, wherein an incremental redundancy (IR) manner is used for first retransmission, and a chase combining (CC) manner is used for subsequent retransmission.

14. The sending device according to claim 13, wherein the sending device is caused to determine the retransmission version RV1 based on the initial transmission bit rate R0 by:

in response to R0 being less than or equal to a preset code rate threshold R_threshold, reading the RV1 is E1 bits from a circular buffer for initial transmission; or in response to R0 being greater than R_threshold, generating an encoded second bit sequence in an incremental redundancy IR manner, and obtaining the RV1 based on the second bit sequence, wherein a length of the second bit sequence is N1, and N1=2*N0.

15. The sending device according to claim 14, wherein the sending device is caused to obtain the RV1 based on the second bit sequence by:

obtaining a subchannel set Q1, wherein Q1 comprises K elements, and the K elements are sequence numbers of K subchannels used to place the K to-be-encoded bits during initial transmission;

obtaining a subchannel set Q2, wherein Q2(i)=Q1(i)+N0, i=0, 1, . . . , and K−1, and N0 is a mother code length of a polar code used during initial transmission;

obtaining a subchannel set Q3, wherein Q3(i)<N0, or Q3(i)∈Q2; and i=0, 1, . . . , and K−1;

determining an extended to-be-encoded bit set Qext, wherein an element in Qext is an element that is in Q3 and that is less than N0;

determining a replicated bit set Qchk=Q2\(Q3\Qext); and performing, based on Q2, Q3, Qext, and Qchk, polar code encoding with a mother code length of N1 on the K to-be-encoded bits, to obtain the second bit sequence.

16. The sending device according to claim 15, wherein Q3 is determined based on a reliability ordering sequence whose length is N1 and a rate matching manner for retransmission.

17. The sending device according to claim 15, wherein the sending device is caused to perform, based on Q2, Q3, Qext, and Qchk, polar code encoding with the mother code length of N1 on the K to-be-encoded bits by:

selecting bit values on some or all subchannels in Qchk, and replicating the bit values to corresponding subchannels in Qext one by one.

18. The sending device according to claim 14, wherein the sending device is caused to obtain the RV1 based on the second bit sequence by:

obtaining the RV1 from first N0 bits of the second bit sequence based on the rate matching manner for retransmission.

19. The sending device according to claim 13, wherein the sending device is further caused to:

perform segmentation based on a transport block size TBS.

20. The sending device according to claim 19, wherein a segment quantity C of the segmentation is:

$$C = \begin{cases} \lceil (TBS + TBcrc)/\text{K\_threshold} \rceil & TBS > \text{K\_threshold} \\ 1 & \text{else} \end{cases},$$

wherein TBcrc is a quantity of cyclic redundancy check CRC bits at a transport block TB level, and K_threshold is a preset first threshold.

21. The sending device according to claim 20, wherein $$K = \begin{cases} \lceil (TBS + TBcrc)/C \rceil + CBcrc & C > 1 \\ TBS + TBcrc & C = 1 \end{cases}, \text{ and}$$

CBcrc is a quantity of CRC bits at a code block CB level.

22. The sending device according to claim 20, wherein $$TBS = 2^{n2} * C * \lfloor (N'_{info} + TBcrc)/(2^{n2} * C) \rfloor - TBcrc,$$

wherein wherein $2^{n2}$ is a quantization unit, n2 is a positive integer, and $N'_{info}$ is obtained by adjusting, based on a quantization level, a volume $N_{info}$ of data that may be transmitted.

23. The sending device according to claim 22, wherein $N'_{info}$ is:

$$N'_{info} = \max(TBSmin, 2^n * \text{round}((N_{info} - TBcrc)/2^n));$$

$$n = \max(n_{min}, \lfloor \log 2(N_{info} - TBcrc) \rfloor - n0); \text{ and}$$

TBSmin is a minimum transport block size, round is a rounding operation, n is a quantization level of a to-be-transmitted transport block, $n_{min}$ is a minimum quantization level, n0 is a quantized adjustment value, and $\lfloor \ \rfloor$ is a rounding down operation.

24. The sending device according to claim 13, wherein the sending device is further caused to:

input the RV0 and the RV1 in a cascading manner into a circular buffer.

25. A retransmission method, comprising:

receiving, by a receiving apparatus, a received signal comprising information of K to-be-encoded bits, wherein a mother code length corresponding to the received signal is N0;

determining an initial transmission version RV0;

determining a length E1 of a retransmission version RV1;

determining the retransmission version RV1 based on an initial transmission code rate R0; and performing decoding based on the RV0 and the RV1, wherein an incremental redundancy (IR) manner is used for first retransmission, and a chase combining (CC) manner is used for subsequent retransmission.

26. A receiving device comprising:

at least one processor; and at least one non-transitory memory having instructions stored thereon that, when executed by the at least one processor, cause the receiving device to:

receive a received signal comprising information about K to-be-encoded bits, wherein a mother code length corresponding to the received signal is N0;

determine an initial transmission version RV0;

determine a length E1 of a retransmission version RV1;

determine the retransmission version RV1 based on an initial transmission bit rate R0; and perform decoding based on the RV0 and the RV1, wherein an incremental redundancy (IR) manner is used for first retransmission, and a chase combining (CC) manner is used for subsequent retransmission.

\*   \*   \*   \*   \*